(12) United States Patent
Kuhara et al.

(10) Patent No.: US 7,021,840 B2
(45) Date of Patent: Apr. 4, 2006

(54) OPTICAL RECEIVER AND METHOD OF MANUFACTURING THE SAME

(75) Inventors: Yoshiki Kuhara, Osaka (JP); Hiromi Nakanishi, Osaka (JP); Mitsuaki Nishie, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/438,633

(22) Filed: May 15, 2003

(65) Prior Publication Data

US 2003/0235376 A1 Dec. 25, 2003

(30) Foreign Application Priority Data

Jun. 25, 2002 (JP) ............... 2002-184880
Nov. 5, 2002 (JP) ............... 2002-321696

(51) Int. Cl.
*G02B 6/42* (2006.01)
(52) U.S. Cl. ............... 385/92; 385/88
(58) Field of Classification Search ............ 385/88–94
See application file for complete search history.

(56) References Cited

U.S. PATENT DOCUMENTS

| | | | | |
|---|---|---|---|---|
| 5,696,862 A | * | 12/1997 | Hauer et al. ............ | 385/88 |
| 5,814,871 A | * | 9/1998 | Furukawa et al. ........ | 257/433 |
| 5,909,523 A | * | 6/1999 | Sakaino et al. ......... | 385/49 |
| 5,972,232 A | * | 10/1999 | Lee et al. ............ | 216/24 |
| 5,987,202 A | * | 11/1999 | Gruenwald et al. ........ | 385/49 |
| 6,074,102 A | * | 6/2000 | Oikawa ............... | 385/88 |
| 6,132,107 A | * | 10/2000 | Morikawa ............. | 385/89 |
| 6,392,283 B1 | * | 5/2002 | Matsuda .............. | 257/461 |
| 6,512,642 B1 | * | 1/2003 | Bourcier et al. .......... | 359/813 |
| 6,659,659 B1 | * | 12/2003 | Malone ............... | 385/94 |
| 6,726,375 B1 | * | 4/2004 | Kato et al. ............ | 385/88 |
| 2002/0181853 A1 | * | 12/2002 | Ido et al. ............ | 385/19 |
| 2003/0147592 A1 | * | 8/2003 | Kim et al. ............ | 385/49 |

FOREIGN PATENT DOCUMENTS

| | | |
|---|---|---|
| JP | 3-214111 | 9/1991 |
| JP | H04-81107 | 7/1992 |
| JP | 05-198828 | 8/1993 |
| JP | 05-275721 | 10/1993 |
| JP | 06-061510 | 3/1994 |
| JP | 6-151903 | 5/1994 |
| JP | 6-275855 | 9/1994 |
| JP | 07-294776 | 11/1995 |
| JP | 7-312430 | 11/1995 |
| JP | 10-090540 | 4/1998 |
| JP | 11-044830 | 2/1999 |
| JP | 11-218651 | 8/1999 |

(Continued)

*Primary Examiner*—Juliana Kang
(74) *Attorney, Agent, or Firm*—Fish & Richardson P.C.

(57) ABSTRACT

An optical receiver comprises a PD for receiving an incident light from an optical fiber, a preamplifier IC for amplifying an electrical signal from the PD, a submount on which the PD and the preamplifier IC are mounted on the same plane, and a package on which the submount is mounted. The PD and the preamplifier IC are directly connected to each other by a wire, and these components are both mounted on the same submount. Therefore, the distance between the PD and the preamplifier IC can be reduced, and parasitic inductance, parasitic capacitance, etc. can be greatly reduced. As a result, an optical receiver is provided which has reduced parasitic inductance and parasitic capacitance, and which is optimum for high speed response.

7 Claims, 13 Drawing Sheets

FOREIGN PATENT DOCUMENTS

| JP | 11-231173 | 8/1999 |
| JP | 2000-028872 | 1/2000 |
| JP | 2000-058881 | 2/2000 |
| JP | 2002232051 A | 8/2002 |

\* cited by examiner

OPTICAL RECEIVER AND METHOD OF MANUFACTURING THE SAME

BACKGROUND OF THE INVENTION

1. Field of the Invention

The present invention relates to an optical receiver used in optical communication and a method of manufacturing the optical receiver. More specifically, the present invention relates to an optical receiver in which parasitic inductance, etc. is reduced and which is suitable for high-speed response, and a method of manufacturing the optical receiver

2. Description of the Background Art

FIGS. 12(A) and 12(B) show a longitudinal sectional structure of a conventional optical receiver. FIG. 12(A) is a front sectional view, and FIG. 12(B) is a side sectional view taken along a section line B—B in FIG. 12(A). An optical receiver 100 shown in FIGS. 12(A) and 12(13) is generally called a CAN type package and is fabricated as follows. After fixing a submount 102 on a package 103, a photodiode (PD) 101 serving as a light receiving device is fixed to the submount 102 by soldering. A plurality of lead pins 104, which are inserted through the package 103, for supplying electrical power or discharging electrical signals are connected to the PD 101 or the submount 102 with wires 105, respectively. A cap 107 provided with a converging lens 106 at its top portion is placed so as to cover the submount 102 and the PD 101, and an optical fiber 108 is fixed in a position above the lens 106. Then, a cover is placed as indicated by the broken lines connecting the optical fiber 108 and the package 103 in FIG. 12, whereby the optical receiver 100 is completed (see, e.g., Japanese Unexamined Utility Model Application Publication No. 4-081107). In the optical receiver 100 thus constructed, the PD 101 receives light incident from the optical fiber 108 through the converging lens 106.

In using the optical receiver 100, it is usually required to amplify an electrical output from the PD 101. Therefore, as shown in FIG. 13, in the conventional optical receiver 100 the lead pins 104 are bent to be mounted on a board (circuit board) 109, and an amplifier 110 is disposed in a rear portion of the board 109 and connected to the optical receiver 100 by wires 105. More specifically, a wiring pattern 111 is formed on the board 109, the lead pins 104 of the optical receiver 100 are soldered to the wiring pattern 111, and the amplifier 110 is connected to the wiring pattern 111 by the wires 105. In other words, the lead pins 104 of the optical receiver 100 and the amplifier 110 are connected to each other through the wires 105 and the wiring pattern 111. Note that an electronic circuit component (not shown) is also mounted on the board 109 behind the amplifier 110.

In recent years, increasingly widespread use of optical communication systems has required optical receivers to be mass-produced at a lower cost in a shorter time. An increase in capacity of transmission is also demanded. High-speed and large-capacity transmission on the order of 1 Gbps, 2.5 Gbps or more has been required in comparison with a conventional level of 156 Mbps or 622 Mbps.

However, it has been difficult to apply the above-described conventional optical receiver to high speed response, since the conventional optical receiver has the drawback that the parasitic inductance, parasitic capacitance, etc. are increased because the optical receiving device and the amplifier, which are separately provided, are connected to each other through a wire and wiring pattern, with a considerable distance existing between the PD in the optical receiver and the amplifier on the board. In particular, the distance between the PD and the amplifier is increased because the lead pins are connected to the board in a bent shape. Such an increase of parasitic inductance and parasitic capacitance makes it difficult to apply the conventional optical receiver to high speed response.

Another problem is that because the optical receiver and the amplifier are separately provided, the board for mounting those components requires a large area. Further, after fabricating the optical receiver, the optical receiver is mounted on the board and connected to the amplifier. Hence, the number of manufacturing steps up to connecting the PD and the amplifier is increased and a relatively long manufacturing time is required.

SUMMARY OF THE INVENTION

Accordingly, it is an object of the present invention to provide an optical receiver, which has reduced parasitic inductance and parasitic capacitance, and which is optimum for high speed response.

Another object of the present invention is to provide a manufacturing method, in which the number of steps for manufacturing an optical receiver can be reduced and the manufacture time for mass production of the optical receiver can be shorten.

According to the present invention, the above objects are achieved by mounting an optical receiving device and an amplifier on the same substrate, and then mounting the substrate on a package.

More specifically, an optical receiver of the present invention comprises an optical receiving device for receiving incident light from an optical fiber, an amplifier for amplifying electrical signals from the optical receiving device, a substrate on which the optical receiving device and the amplifier are mounted on the same plane, and a package on which the substrate is mounted.

The optical receiver is preferably manufactured by the steps of:

(1) mounting, on the same plane of a substrate, an optical receiving device for receiving incident light from an optical fiber and an amplifier for amplifying electrical signals from the optical receiving device, thereby forming a submodule;

(2) mounting the submodule on a package; and (3) connecting a plurality of lead pins provided on the package to the optical receiving device and the amplifier by respective wires.

According to the optical receiver of the present invention, since the optical receiving device and the amplifier are mounted on the same substrate, the distance between the optical receiving device and the amplifier can be reduced and both the components can be directly connected to each other by the wires. In the optical receiver of the present invention having such a construction, parasitic inductance, parasitic capacitance, etc., which occur, for example, due to the lead pins being mounted in a bent state, can greatly be reduced such that high speed response can be realized. Also, according to the present invention, since the optical receiving device and the amplifier are mounted on the same substrate, a board (circuit board) on which the optical receiver is mounted no longer requires an area for mounting the amplifier, which has been required in the conventional art, and the area required for the board can be reduced. Furthermore, the manufacturing method of the present invention requires fewer manufacturing steps, can realize higher workability, and is more suitable for mass production in a shorter time than the conventional art.

The present invention will be described below in more detail.

In the present invention, the optical receiver is, for example, a semiconductor optical receiving device such as a photodiode (PD) and an avalanche photodiode (APD). Also, when the optical receiving device has a light receiving layer for a long wavelength band from 1 μm to 1.6 μm, the optical receiving device is preferably formed of an InGaAs- or InGaAsP-base material from the standpoint of achieving high sensitivity. When the light receiving layer covers such a long wavelength band, the optical receiving device may be formed of other suitable materials such as Ge. When the light receiving layer covers a shorter wavelength band than the above-mentioned band, the optical receiving device may be formed of other suitable materials such as Si. When the optical receiving device is formed of an InGaAs-base material, for example, the size of the optical receiver may be about 0.25 to 0.7 mm wide×0.25 to 0.7 mm long×0.3 to 0.5 mm thick. The optical receiving device may be of the edge illuminated type, the front illuminated type, or the rear illuminated type. In the case of the rear illuminated type, the following advantages are obtained: (1) the optical receiving device can easily receive light because a light receiving area is usually circular, (2) superior tolerance (resistance characteristics against mounting displacement) is obtained in mounting work, and (3) because the size of the light receiving area can be reduced to the size of a bonding pad (connection portion to a wire), the p-n junction area can be kept small and the electric static capacitance can be reduced. Based on those advantages, the optical receiving device of the rear illuminated type can operate at high speed not less than 1 Gbps and is optimum for high speed response. When the high speed operation such as required for the rear illuminated type is not essential (i.e., in the case of the operation ranging from 156 Mbps to 622 Mbps), the optical receiving device of the front illuminated type is sufficiently applicable even in an arrangement in which its light receiving surface is directed toward the substrate side (i.e., even in the so-called upside-down mounting).

Examples of the amplifier include Si—IC and GaAs—IC, etc. The size of the amplifier may be, for example, about 0.5 to 1.5 mm wide×0.5 to 1.5 mm long ×0.2 to 1 mm thick.

The optical receiving device can be mounted to the substrate by soldering with a PbSn or AuSn solder. For instantaneous mounting, the soldering is preferably performed using an automatic soldering apparatus such as an automatic die (semiconductor chip) bonder. The automatic die bonder is preferably afforded with pattern recognition of the position of a mounting pattern and the shape of a chip sucked to a semiconductor chip suction collet so that the optical receiving device can be mounted at high position accuracy. The amplifier can be mounted to the substrate by bonding with an electrically conductive epoxy resin.

The optical receiving device and the amplifier are preferably directly connected to each other by wires. The wires are preferably metal wires of gold (Au) or aluminum (Al).

The substrate (submount) on which the optical receiving device and the amplifier are mounted is preferably formed of an Si single crystal, glass, or a ceramic such as AlN or alumina (Al$_2$O$_3$). More specifically, the Si single crystal is advantageous in that it can be processed by photolithography with high accuracy. The glass is advantageous in that it has translucency and is relatively inexpensive. The ceramic is advantageous in that it can be freely machined. As an alternative, the substrate may be formed of any suitable resin such as an epoxy resin or a liquid crystal polymer. The size of the substrate is required to be just sufficient enough for mounting the optical receiving device and the amplifier on it, and may be, for example, about 1.0 to 1.25 mm wide×2.0 to 3.0 mm long×0.5 to 2.5 mm thick. Mounting patterns are preferably formed on the substrate in advance so that the optical receiving device and the amplifier can be mounted on the respective mounting patterns.

The optical receiving device can be mounted to the substrate by soldering with a PbSn or AuSn solder. For instantaneous mounting, the soldering is preferably performed using an automatic soldering apparatus such as an automatic die (semiconductor chip) bonder. The automatic die bonder is preferably operated after processing for pattern recognition of the position of the mounting pattern and the shape of a chip sucked to a semiconductor chip suction collet so that the optical receiving device can be mounted at high position accuracy. The amplifier can be mounted to the substrate by bonding with an electrically conductive epoxy resin.

When the optical receiving device is of the rear illuminated type or the front illuminated type, the substrate is preferably provided with a reflective surface for changing an optical path of the incident light so as to enter the optical receiving device. When the optical receiving device is of the edge illuminated type, the optical receiving device can be mounted relatively easily on the substrate such that the edge face receiving the incident light is positioned to face the incident light, and hence there is no problem with the absence of the reflective surface in the substrate. On the other hand, when the optical receiving device is of the rear illuminated type or the front illuminated type, it is difficult to mount the optical receiving device on the substrate such that the light receiving area is positioned to face the incident light. Therefore, the optical path of the incident light must be changed so as to guide the incident light to enter the light receiving area. For this reason, when the optical receiving device is of the rear illuminated type or the front illuminated type, a substrate provided with a reflective surface is preferably employed. The reflective surface may be formed, for example, by providing a slanted surface in the substrate and plating a metal, e.g., gold (Au), on the slanted surface. Also, at least one reflective surface must be provided, though a plurality may be provided that the incident light is able to enter the light receiving area of the optical receiving device.

In order to more surely introduce the incident light to the reflective surface, an optical path groove is preferably formed in the substrate. In this case, at least one of the surfaces defining the optical path groove may be formed as a reflective surface. The optical path groove can be formed by, e.g., etching. In practice, the optical path groove can be formed by the so-called photo-etching process. More specifically, an oxide film, such as an SiO$_2$ film, is formed as an insulating layer on the substrate by the chemical vapor deposition (CVD) method, e.g., plasma chemical vapor deposition (CVD). The formed coating film and the substrate are then partly removed by a means such as chemical etching, whereby the optical path groove is formed in the substrate. In such case, metal plating, such as Au-plating, is preferably applied to not only a surface of the optical path groove serving as the reflective surface, but also to the remaining surfaces of the optical path groove from the standpoint of improving the reflection efficiency and increasing the output current. On the substrate on which the optical path groove and the reflective surface have been formed, mounting patterns serving also as alignment marks for the optical receiving device and the amplifier are formed.

The mounting patterns can be formed, for example, by plating Au—Sn or the like. A set of the optical path groove, the reflective surface, and the mounting patterns is formed repeatedly over an entire surface of a material substrate. By cutting the material substrate into unit pieces, individual substrates each including the set of the optical path groove, the reflective surface, and the mounting patterns can be obtained.

The optical receiving device may be arranged relative to the substrate such that the edge face (surface facing the incident light) of the optical receiving device is positioned nearly perpendicular to an optical axis of the incident light from the optical fiber. However, this arrangement may cause unstable operation of a light-emitting device on the sending side because the incident light may be returned to the optical fiber side as a result of reflection at the edge face of the optical receiving device. Therefore, the optical receiving device is preferably mounted on the substrate at an inclination such that the edge face of the optical receiving device is positioned not perpendicular to the optical axis of the incident light. In practice, the perpendicular line to the edge face of the optical receiving device is preferably inclined at about 4 to 8° relative to the optical axis. In practice, the vertical line to the edge face of the optical receiving device is preferably inclined at about 4 to 8° relative to the optical axis.

A package for mounting the substrate (submodule), on which the optical receiving device and the amplifier have been mounted, is preferably a coaxial package. The term "coaxial package" means a package in which an axis of the package is coaxial with the incident light. A commercially available package generally called a CAN type package can be used. Preferable materials for the package include iron (Fe), copper (Cu), a copper-nickel (Cu—Ni) alloy, stainless, an iron alloy such as Fe—Co—Ni, and other suitable metals. A metal coaxial type package has superior stability for long term use because it is robust and hermetically sealed (completely enclosed), is highly thermally radiative, and has the function of shielding electromagnetic noises from the external. Also, since the metal coaxial type package is widely used for various purposes and is mass-produced, it is relatively inexpensive and contributes to reducing the cost. The submodule can be mounted to the package, for example, by providing, on the package, a pole for mounting the submodule as required, and fixing the submodule to the pole by soldering with, e.g., AuSn or SnPb solder. The soldering may be performed using an automatic die bonder.

The optical receiver of the present invention is of, for example, the pig tail type having an optical fiber at its one end, or the receptacle type having a connecting portion to an optical connector at its one end. In either type, the optical receiving device is optically coupled to an optical fiber. As a more practical arrangement, in the former pig tail type, a cylindrical metal holder including the optical fiber fixed thereto is mounted to a metal sleeve for supporting the package, to which a cap provided with a converging lens at its top portion is fixed. In the latter receptacle type, the optical receiver has at one end a connecting portion to a connector provided with an optical fiber ferrule, and at the other end a holder for holding the optical receiving device, etc. The receptacle type is easier to handle because it is unnecessary to route the optical fiber.

With the optical receiver of the present invention, as described above, since the optical receiving device and the amplifier are mounted on the same substrate, superior advantages are obtained in that parasitic inductance, parasitic capacitance, etc. can be greatly reduced and higher speed response can be realized. Accordingly, the optical receiver of the present invention is applicable to high-speed and large-capacity transmission on the order of 1 Gbps or more. Also, in the optical receiver of the present invention, since a substrate including the optical receiving device and the amplifier both integrally mounted thereon is mounted on a package, the area required for a board to mount the optical receiver can be reduced. Further, it is expected that the optical receiver of the present invention can be manufactured with fewer manufacturing steps and can be mass-produced in less time than the conventional optical receiver.

BRIEF DESCRIPTION OF THE DRAWINGS

FIGS. 3(A) to 3(C) are explanatory views showing successive manufacturing steps of the optical receiver of the present invention, in which FIG. 3(A) shows a step of forming a submodule, FIG. 3(B) shows a step of mounting the submodule to a package, and FIG. 3(C) shows a wire connecting step;

FIGS. 4(A) and 4(B) are enlarged schematic views of a submodule using a photodiode (PD) of the edge illuminated type, of which FIG. 4(A) is a front view and FIG. 4(B) is a sectional view taken along a section line B—B in FIG. 4(A);

FIGS. 5(A) and 5(B) are enlarged schematic views of a submodule using a PD of the rear illuminated type and a substrate translucent to an incident light, in which FIG. 5(A) is a front view and FIG. 5(B) is a sectional view taken along a section line B—B in FIG. 5(A);

FIGS. 6(A) and 6(B) are enlarged schematic views of a submodule using a PD of the rear illuminated type and a substrate provided with a reflective surface, in which FIG. 6(A) is a front view and FIG. 6(B) is a sectional view taken along a section line B—B in FIG. 6(A);

FIGS. 7(A) and 7(B) are enlarged schematic views of a submodule using a PD of the edge illuminated type and a substrate provided with an optical path groove, in which FIG. 7(A) is a front view and FIG. 7(B) is a sectional view taken along a section line B—B in FIG. 7(A);

FIGS. 8(A) and 8(B) are enlarged schematic views of a submodule using a substrate provided with two reflective surfaces, in which FIG. 8(A) is a front view and FIG. 8(B) is a sectional view taken along a section line B—B in FIG. 8(A);

FIGS. 9(A) and 9(B) are enlarged schematic views of a submodule using a PD of the front illuminated type, in which FIG. 9(A) is a front view and FIG. 9(B) is a sectional view taken along a section line B—B in FIG. 9(A);

FIGS. 12(A) and 12(B) show a longitudinal sectional structure of a conventional optical receiver, in which FIG. 12(A) is a front sectional view and FIG. 12(B) is a side sectional view taken along a section line B—B in FIG. 12(A)

DESCRIPTION OF THE PREFERRED EMBODIMENTS

Figure 1:
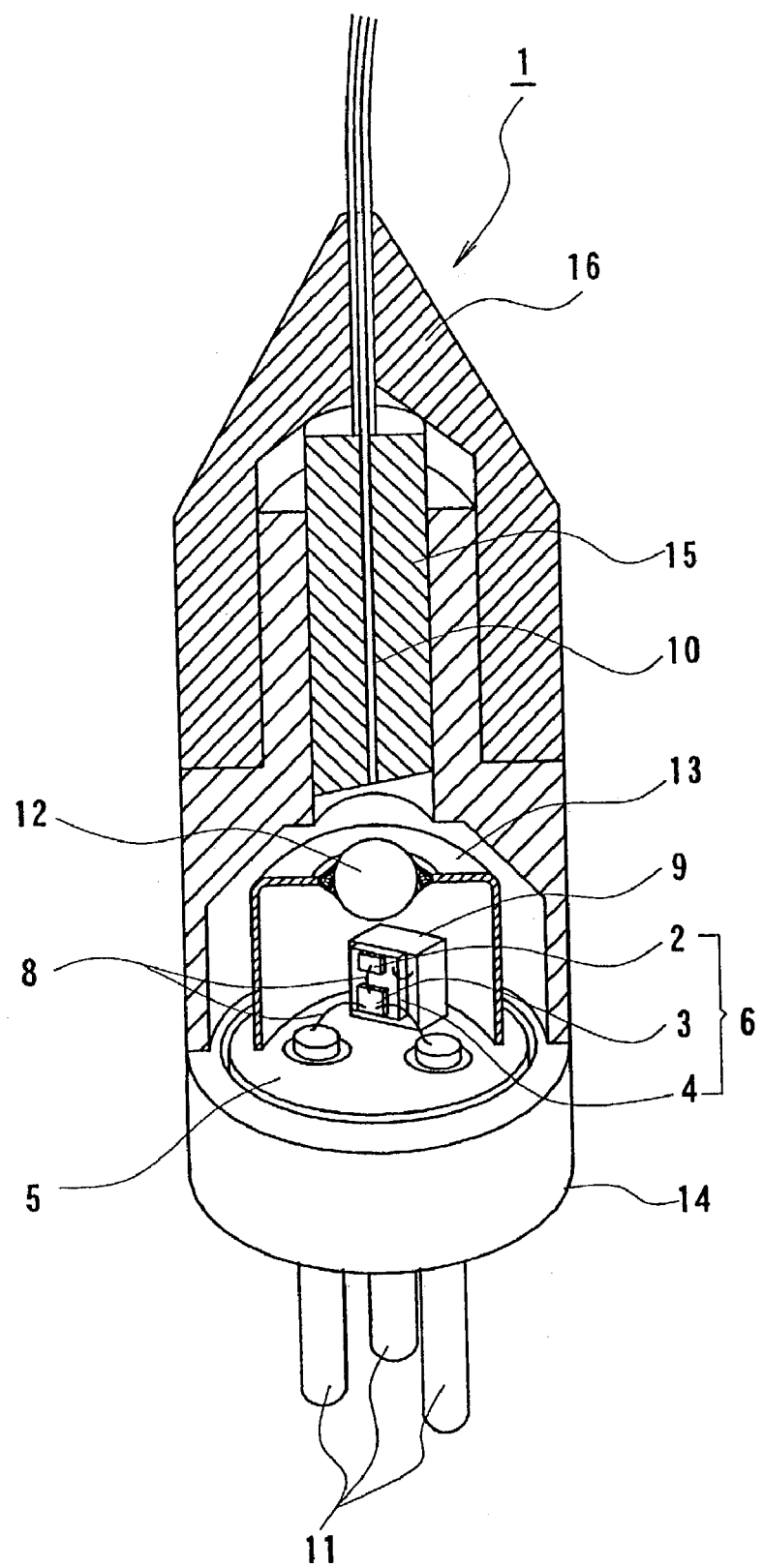
FIG. 1 is a partial sectional view showing one example of a pig-tail-type optical receiver of the present invention.

Preferred embodiments of the present invention will be described below in connection with several Examples. Note that, in the following description with reference to the drawings, the same components are denoted by the same symbols and a redundant description is omitted. Also, a dimensional ratio of the components shown in the drawings is illustrated only by means of example and dose not always coincide with the explanation.

<Pig Tail Type>

EXAMPLE 1

Case of Using PD of Edge Illuminated Type

Figures 2A, 2B:
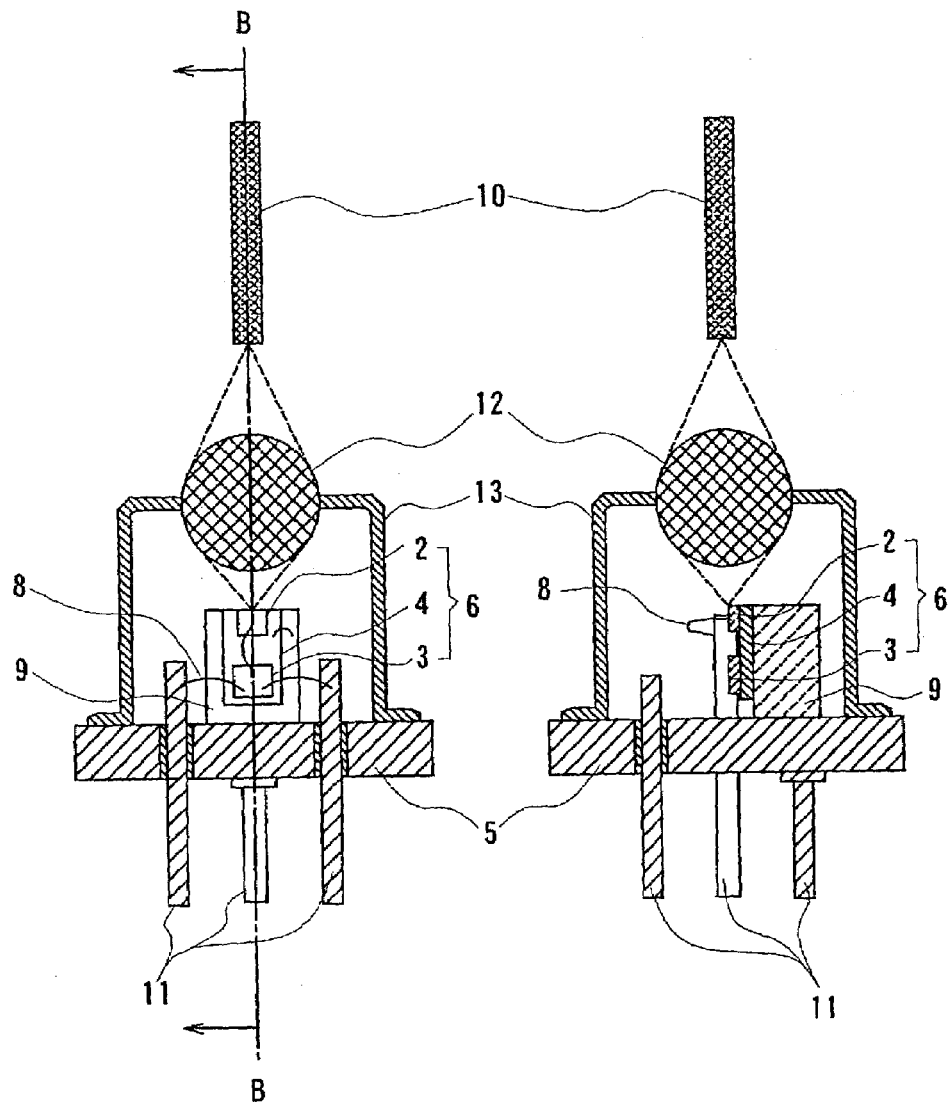
FIG. 2(A) is an enlarged front sectional view of a submodule and surroundings thereof.
FIG. 2(B) is a side sectional view taken along a section line B—B in FIG. 2(A)

FIG. 1 is a partial sectional view showing one example of a pig-tail-type optical receiver of the present invention, FIG. 2(A) is an enlarged front sectional view of a submodule and surroundings thereof, and FIG. 2(B) is a side sectional view taken along a section line B—B in FIG. 2(A). An optical receiver 1 of the present invention comprises a photodiode (PD) 2 for receiving incident light from an optical fiber 10, a preamplifier integrated circuit (IC) 3 for amplifying an electrical signal from the PD 2, a submount 4 on which the PD 2 and the preamplifier IC 3 are mounted on the same plane, and a package 5 on which the submount 4 is mounted.

Figure 3B:
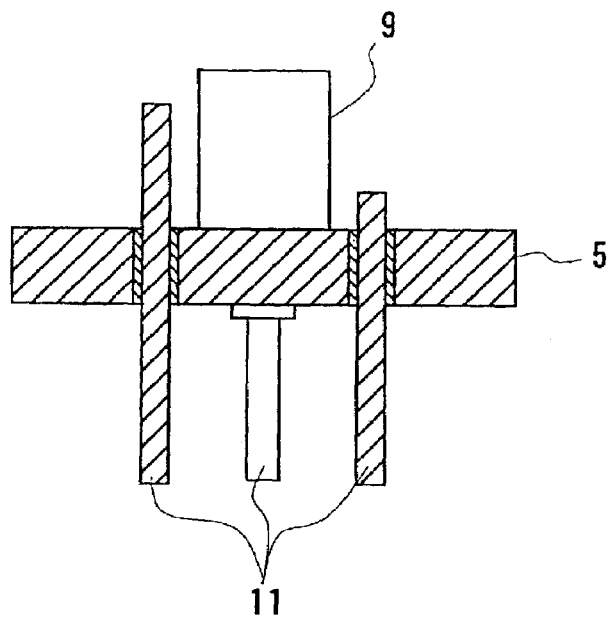
Figure 3A:
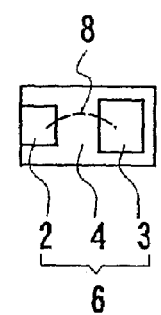
Figure 3C:
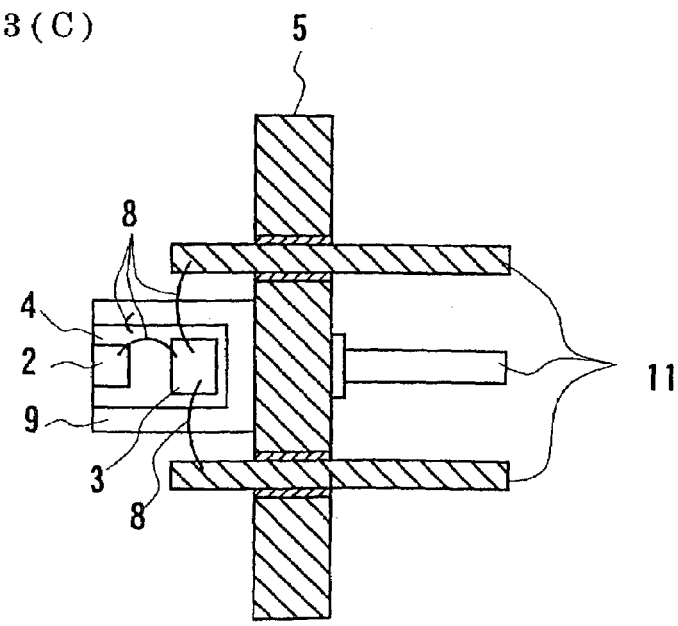
Figure 4A:
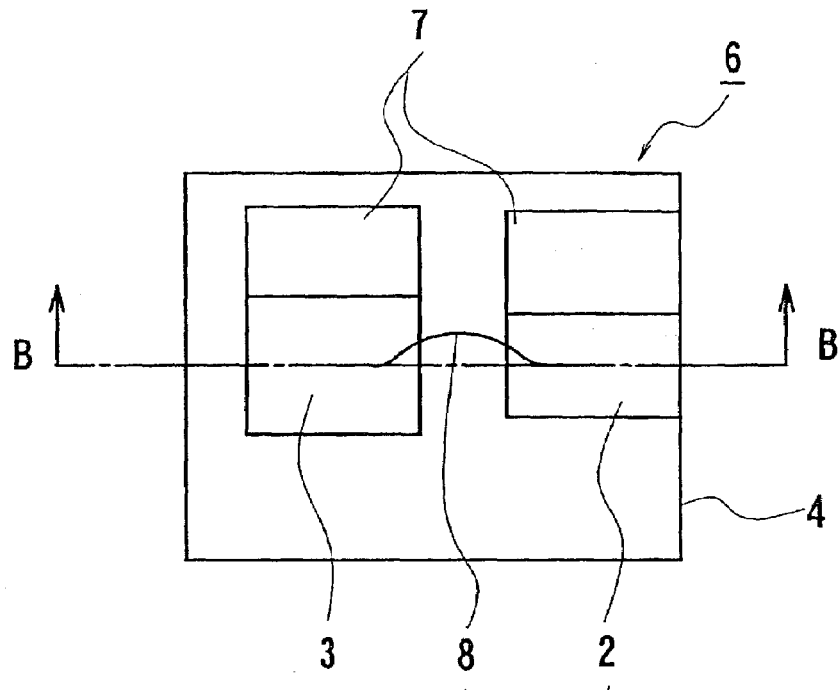
Figure 4B:
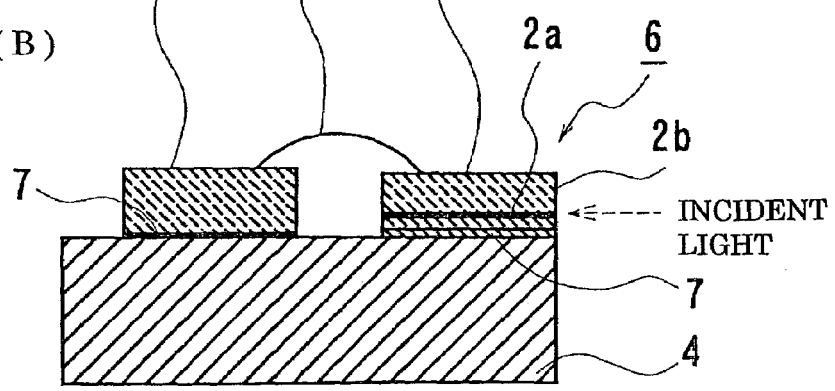

The optical receiver 1 of the present invention was manufactured in this Example as follows. FIGS. 3(A) to 3(C) are explanatory views showing successive manufacturing steps of the optical receiver of the present invention, in which FIG. 3(A) shows a step of forming the submodule, FIG. 3(B) shows a step of mounting the submodule to the package, and FIG. 3(C) shows a wire connecting step. FIGS. 4(A) and 4(B) are enlarged schematic views of a submodule using a PD of the edge illuminated type, in which FIG. 4(A) is a front view and FIG. 4(B) is a sectional view taken along a section line B—B in FIG. 4(A).

(1) Step of Forming Submodule

The PD 2 used in this Example was of the edge illuminated type having a light receiving layer formed of an InGaAsP-base material and suitable for a wavelength band from 1 μm to a 1.6 μm. The PD 2 had a size of 0.25 mm width ×0.5 mm length×0.3 m thickness. Here, the width means a dimension in the horizontal direction as viewed in FIG. 2(A), the length means a dimension in the up-and-down direction as viewed in FIG. 2(A), and the thickness means a dimension in the horizontal direction as viewed in FIG. 2(B). The preamplifier IC 3 serving as the amplifier was formed of a Si-IC and had a size of 1.0 mm width×1.0 mm length×0.3 mm thickness. Also, the submount 4 used in this Example was prepared by plating Au—Sn in thickness of 3 μm on the same plane of a material substrate made of alumina, forming respective mounting patterns 7 (see FIG. 4) for the PD 2 and the preamplifier IC 3, and cutting the material substrate into unit pieces. The submount 4 thus cut had a size of 1.25 mm width×2.0 mm length×0.5 mm thickness. As shown in FIG. 2(A), the PD 2 and the preamplifier IC 3 were mounted on the submount 4 (resulting assembly will be referred to as a submodule 6). The PD 2 was soldered with a PbSn solder using an automatic die bonder. The preamplifier IC 3 was fixed in place by bonding with an electrically conductive epoxy resin. Then, the PD 2 and the preamplifier IC 3 were connected to each other by an Au wire 8 (denoted by a broken line in FIG. 3(A)) with a diameter of 30 μm. The wire connection was performed by an automatic wire bonder. Note that there are additional wires to those shown in FIGS. 3(A) to 3(C). The submodule 6 including the PD 2 and the preamplifier IC 3 both mounted on the same plane of the submount 4, as shown in FIGS. 3(A), 4 (A) and 4(B), was thus completed.

(2) Step of Mounting Submodule to Package

The package 5 used in this Example was made of Fe—Co—Ni and was of the coaxial type having a diameter of 5.6 mm (circle passing the center of an arrangement pattern of lead pins had a diameter of 2.54 mm). A pole 9 for mounting the submodule 6 was provided on the package 5 (see FIG. 3(B)). Also, an appropriate number of lead pins 11 were inserted through the package 5 for supplying electrical power and flowing out electrical signals. The number of the lead pins 11 may be from 3 to 6 as required in each individual case. In this Example, three lead pins 11 were employed and each had a diameter of ϕ 0.45 mm. The submodule 6 was mounted to a surface of the pole 9 on the package 5. The submodule 6 was mounted such that a light receiving area 2a (see FIG. 4(B)) of the PD 2 was extended almost parallel to the optical axis of the incident light from the optical fiber 10 (see FIGS. 2(A) and 2(B)), i.e., that an edge face 2b of the PD 2 was almost perpendicular to the optical axis. The submodule 6 was mounted by soldering with an AuPb solder using an automatic die bonder. The mounting of the submodule 6 can be performed with higher workability in a state where the submodule 6 is rotated at 90° from the state shown in FIG. 3(B) to the state shown in FIG. 3(C) in which the axial direction of the lead pins 11 is horizontally oriented.

(3) Wire Connecting Step

Then, connections between the PD 2 and the lead pins 11 (see FIG. 2(B)), between the preamplifier IC 3 and the lead pins 11 (see FIG. 3(C), and between the submodule 6 and the pole 9 (see FIG. 3(C)) were made using Au wires 8 each having a diameter of 30 μm. The wire connections were performed in succession using an automatic wire bonder. As with the mounting of the submodule 6, the wire connections can be performed with higher workability by rotating the submodule 6 such that the axial direction of the lead pins 11 is horizontally oriented (see FIG. 3(C)).

(4) A cap 13 provided with a converging lens 12 at its top portion was placed on the package 5 obtained in the above-described step, and the cap 13 was fixed to the package 5 by electrical welding (see FIGS. 2(A) and 2(B)). This welding step can be performed with higher workability by rotating the package 5 such that the axial direction of the lead pins 11 is vertically oriented. Subsequently, as shown in FIG. 1, the package 5 including the cap 13 fixed thereto was attached to a metal sleeve 14, and a cylindrical metal holder 15 including the optical fiber 10 fixed thereto was inserted in the sleeve 14 from above. Then, incident light was introduced from the optical fiber 10 to the PD 2, and the holder 15 was fixed to the sleeve 14 in a position where optimum output was obtained. Finally, a cover 16 was fitted over the holder 15. Thus, the pig-tail-type optical receiver 1 of the present invention was completed.

With the thus-manufactured optical receiver of the present invention, since the PD and the preamplifier IC are mounted on the same submount, parasitic inductance, parasitic capacitance, etc. can be greatly reduced and higher speed response can be realized. Also, with the above-described method of manufacturing the optical receiver according to the present invention, since the preamplifier IC is disposed within the package, the step of connecting the PD and the preamplifier IC is no longer required after forming the optical receiver, and the manufacturing time can be reduced in comparison with that required in the conventional art.

EXAMPLE 2

Case of Using PD of Rear Illuminated Type

In the optical receiver of the present invention, the optical receiving device may be a PD of the rear illuminated type instead of the PD of the edge illuminated type shown in Example 1. Basic construction and manufacturing steps in this Example 2 are similar to those in Example 1. This Example 2 differs from Example 1 in that a reflective surface is provided in the submount 4. A description primarily of this difference will be given below.

2-1: Example Allowing Incident Light to Pass through Submount

Figure 5A:
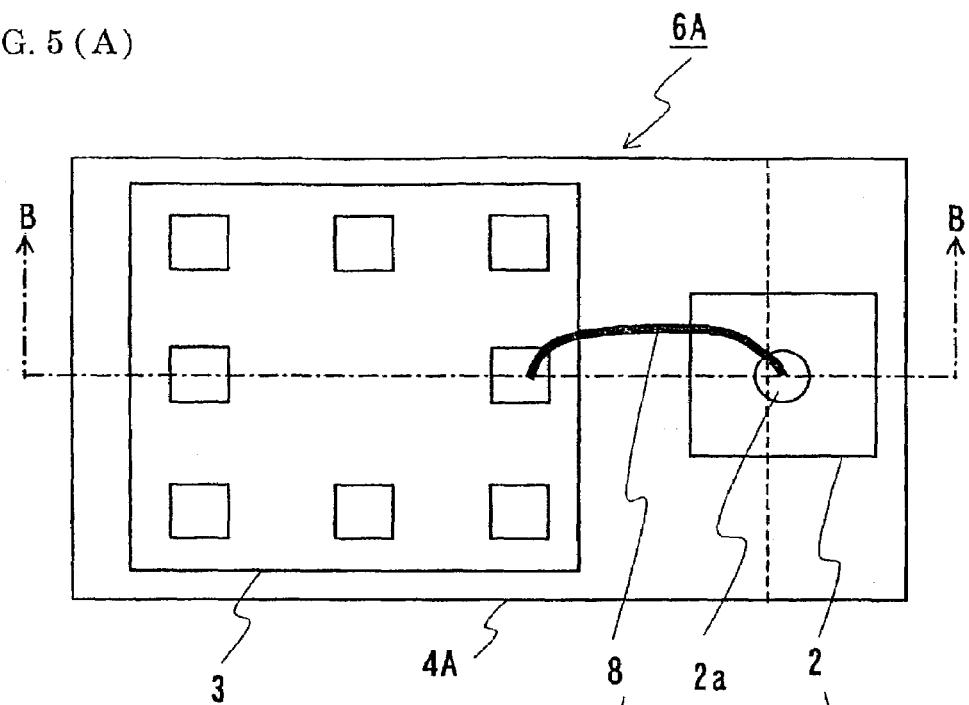
Figure 5B:
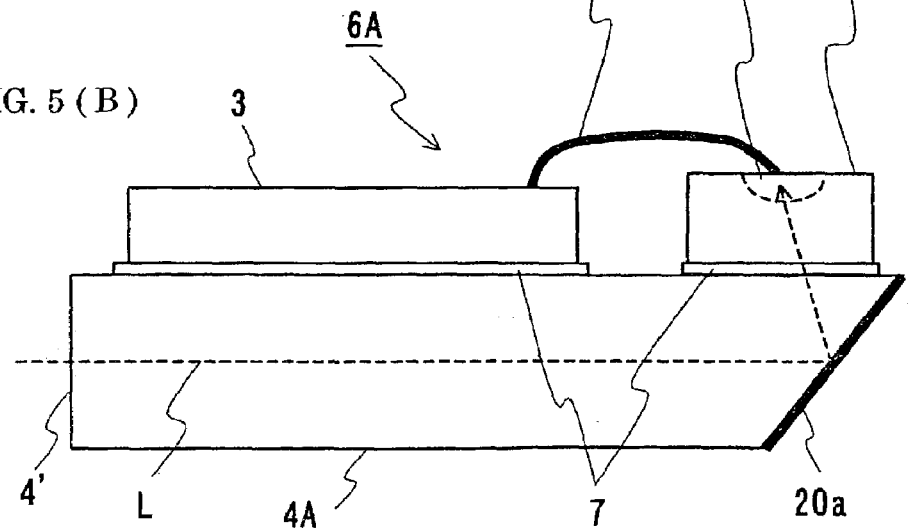

FIGS. 5(A) and 5(B) are enlarged schematic views of a submodule using a PD of the rear illuminated type and a submount translucent to the incident light, in which FIG. 5(A) is a front view and FIG. 5(B) is a sectional view taken along a section line B—B in FIG. 5(A). A submount 4A used in this Example was made of glass and had a size of 1.0 mm width×2.5 mm maximum length×2.3 mm thickness. Here, the width means a dimension in the up-and-down direction as viewed in FIG. 5(A), the maximum length means a maximum dimension in the horizontal direction as viewed in FIG. 5(B), and the thickness means a dimension in the up-and-down direction as viewed in FIG. 5(B). These definitions are similarly applied to FIGS. 6(A) and 6(B) described later. One surface of the submount 4A was polished to have a slanted surface, and Au was plated on the slanted surface to form a reflective surface 20a. Also, after forming the reflective surface 20a in the submount 4A, mounting patterns 7 were formed by plating Au—Sn in thickness of 3 μm on the reflective surface 20a. Subsequently, a submodule 6A including the PD 2 and the preamplifier IC 3 both mounted on the submount 4 was obtained through similar steps to those described above in Example 1. In this Example 2-1, the PD 2 was mounted on the submount 4A such that one surface of the PD 2 opposed to the other surface thereof on the light receiving area 2a side made contact with the mounting pattern 7. Furthermore, the obtained submodule 6A was mounted on the package 5 (see FIGS. 2(A) and 2(B)) such that the reflective surface 20a was positioned to face or intersect the optical axis of an incident light L from the optical fiber (see FIGS. 2(A) and 2(B)), i.e., such that an edge face 4' of the submount 4A was nearly perpendicular to the optical axis. These arrangements are similarly applied to Examples 2-2 and 2-3 described later.

The PD 2 used in this Example was an InGaAs-base PD (having a size of 0.5 mm width×0.5 mm length×0.2 mm thickness and a 50 μm diameter of the light receiving area 2a), which is often employed in a wavelength band from 1.0 μm to a 1.6 μm. Because of the PD 2 being of the rear illuminated type, when the PD 2 is mounted on the submount 4A, the light receiving area 2a is positioned on the side away from the submount 4A (i.e., on the upper side as viewed in FIG. 5(B)). With such an arrangement, the incident light L from the optical fiber passes through the submount 4A and impinges upon the reflective surface 20a. After the optical path is changed by the reflective surface 20a, the incident light L enters the light receiving area 2a of the PD 2 mounted on the submount 4A.

Using the PD2 of the rear illuminated type, this Example is able to operate at high speeds of 1 Gbps or higher and is more suitable for high speed response. Also, in this Example, the preamplifier IC 3 capable of operating at high speeds is mounted on the same plane of the submount 4A adjacent to the PD 2, and the PD 2 and the IC 3 are directly connected to each other by the wire 8. Hence, superior characteristics of the PD2 of the rear illuminated type can be utilized maximally.

2-2: Example Having Reflective Surface on Submount

Figure 6:
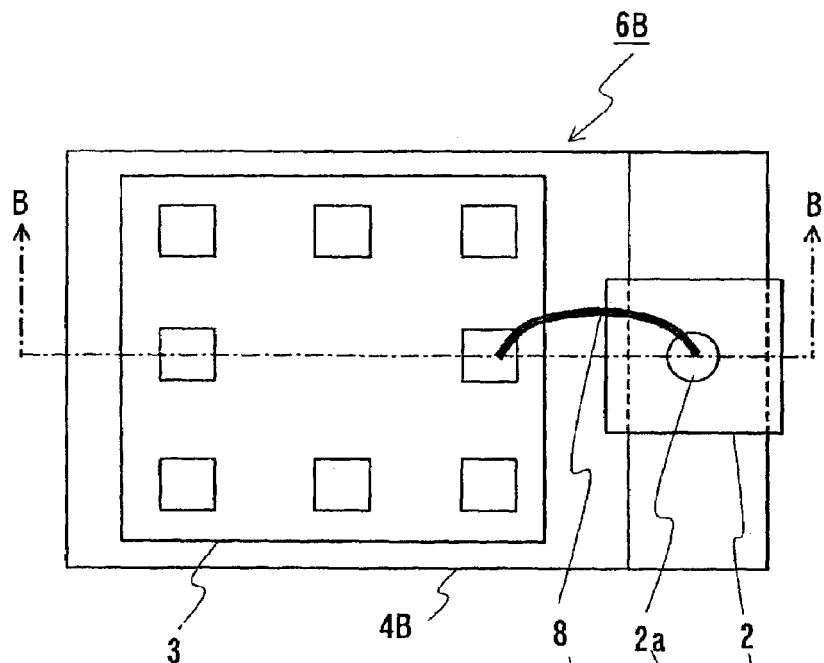
Figure 6:
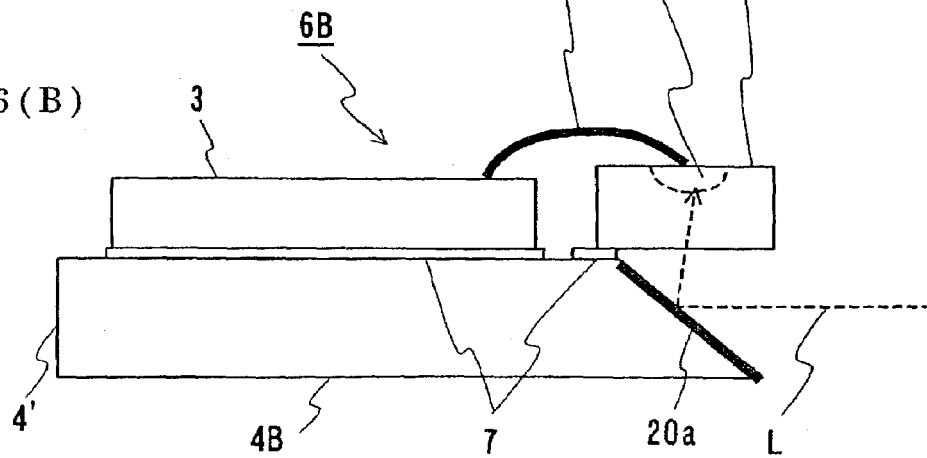

FIGS. 6(A) and 6(B) are enlarged schematic views of a submodule using a PD of the rear illuminated type and a submunt provided with a reflective surface, in which FIG. 6(A) is a front view and FIG. 6(B) is a sectional view taken along a section line B—B in FIG. 6(A). While the above Example 2-1 employs the submount 4A allowing the incident light L to pass through it, a substrate not allowing the incident light L to pass through it, i.e., a submount 4B made of a Si single crystal, can also be used. A submodule 6B including the submount 4B is preferably mounted on the package 5 (see FIGS. 2(A) and 2(B)) such that the incident light L from the optical fiber (see FIGS. 2(A) and 2(B)) impinges upon a reflective surface 20a.

2-3: Example Having Optical Path Groove in Submount

Figure 7:
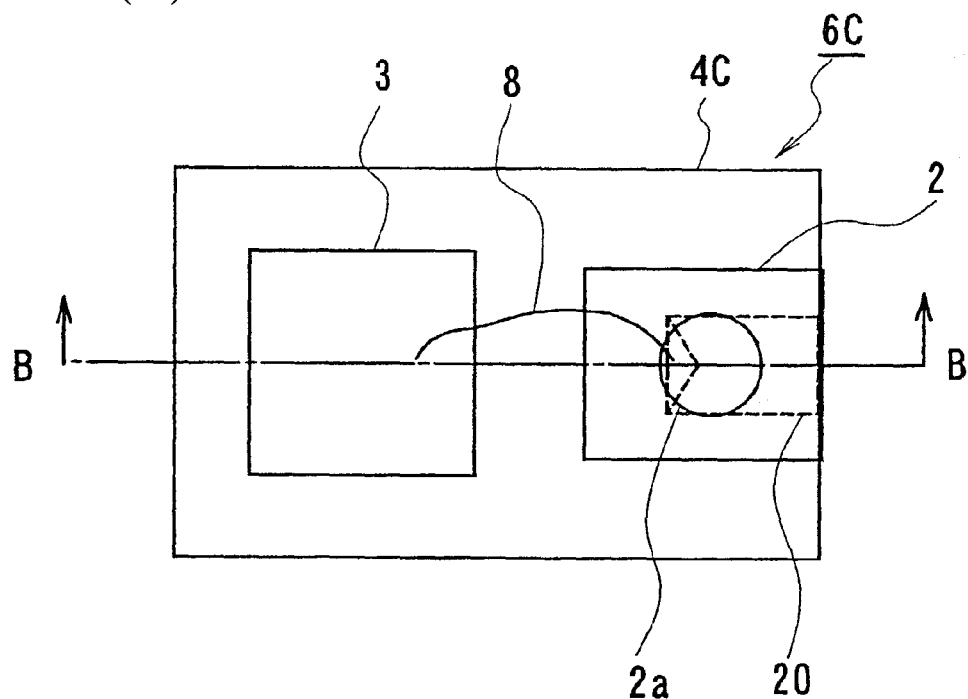
Figure 7:
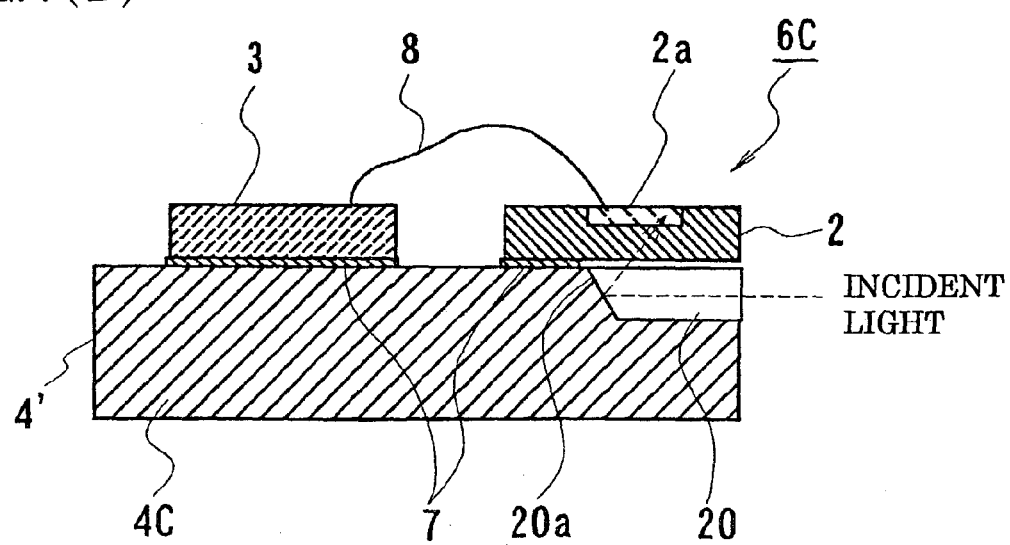

While the submount is provided with only the reflective surface in Examples 2-1 and 2-2 described above, it is preferable that an optical path groove is also provided in the submount 4 for more stably introducing the incident light to enter the PD with the aid of the reflective surface. An example having an optical path groove in addition to the reflective surface in the submount will therefore be described below. FIGS. 7(A) and 7(B) are enlarged schematic views of a submodule using a submount provided with an optical path groove, in which FIG. 7(A) is a front view and FIG. 7(B) is a sectional view taken along a section line B—B in FIG. 7(A). The basic construction of a submodule 6C in this Example is similar to that in Example 2-2. This Example 2-3 differs from Example 2-2 in that an optical path groove 20 is provided in a submount 4C. A description primarily of this difference will be given below.

In this Example, the reflective surface 20a and the optical path groove 20 were formed in the submount 4C as follows. An $SiO_2$ film (not shown) having a thickness of 1 μm was formed as an insulating layer on a material substrate made of Si ({100} plane) by the plasma CVD. The formed $SiO_2$ film and the material substrate were then partly removed by chemical etching to form the optical path groove 20 for introducing the incident light from the optical fiber 10 (see FIG. 1) so as to impinge upon the PD 2. In this Example, the optical path groove 20 had a width of 250 μm, a depth of 177 μm, and a maximum length of 200 μm. Here, the width means a dimension in the up-and-down direction as viewed in FIG. 7(A), the maximum length means a maximum dimension in the horizontal direction as viewed in FIG. 7(A), and the depth means a dimension in the up-and-down direction as viewed in FIG. 7(B). These definitions are similarly applied to Example 2-4 described later Further, in this Example, Au was plated on surfaces ({111} planes) of the optical path groove 20, and one of the plated surfaces was employed as the reflective surface 20a.

Then, as in Example 1, mounting patterns 7 were formed on the material substrate on which the reflective surface 20a and the optical path groove 20 had been formed, and the submount 4C was obtained by cutting the material substrate into unit pieces. The submount 4C was the same size as that in Example 1. Subsequently, the submodule 6C including the PD 2 and the preamplifier IC 3 both mounted on the submount 4C was obtained through steps similar to those described above in Example 1. In this Example 2-3, as in above Example 2-1, the submodule 6C was obtained by mounting the PD 2 on the submount 4C such that one surface of the PD 2 opposed to the other surface thereof on the light receiving area 2a side made contact with the mounting pattern 7 and the PD 2 was positioned to lie over the optical path groove 20. Subsequent manufacturing steps were similar to those in Example 1 described above.

With this Example having such an arrangement, as shown in FIG. 7(B), the incident light is introduced to the optical path groove 20 in the submount 4C and impinges upon the reflective surface 20a. After the optical path has been changed by the reflective surface 20a, the incident light L can be guided to enter the light receiving area 2a of the PD 2 mounted on the submount 4C.

2-4: Example Having Two Reflective Surfaces

Figure 8A:
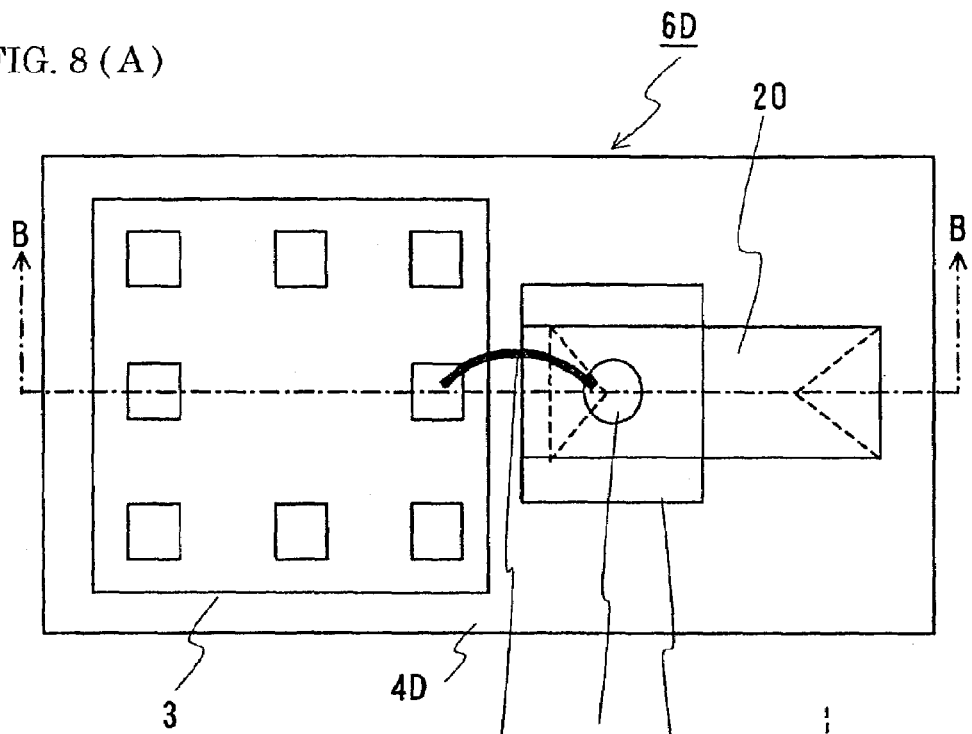
Figure 8B:
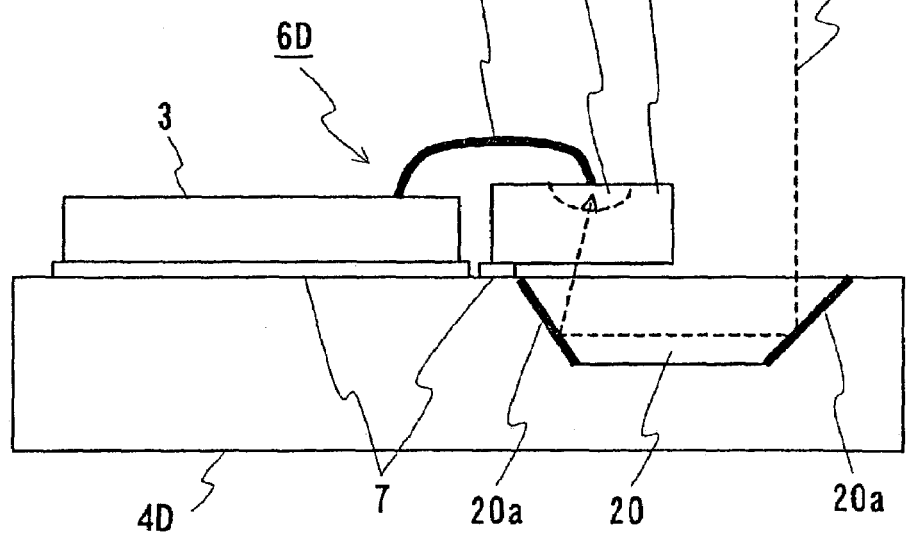

While the submount is provided with only one reflective surface in Example 2-3 described above, two reflective surfaces may be provided. An example having two reflective surfaces will therefore be described below. FIGS. 8(A) and 8(B) are enlarged schematic views of a submodule using a submount provided with two reflective surfaces, in which FIG. 8(A) is a front view and FIG. 8(B) is a sectional view taken along a section line B—B in FIG. 8(A). The basic construction of a submodule 6D in this Example is similar to that in Example 2-3. This Example 2-4 differs from Example 2-3 in that two reflective surfaces are provided in a submount 4D. A description primarily of this difference will be given below.

In this Example 2-4, the optical path groove 20 was formed in the submount 4D in a manner similar to that in above Example 2-3. More specifically, an $SiO_2$ film (not shown) having a thickness of 1 μm was formed on a material substrate made of Si ({100} plane) by the plasma CVD. The formed $SiO_2$ film and the material substrate were then partly removed by chemical etching to form the optical path groove 20. In this Example, the optical path groove 20 had a width of 100 μm, a maximum length of 1,000 μm, and a depth of 100 μm. Further, in this Example, Au was plated on surfaces ({111} planes) of the optical path groove 20, and the two opposing plated surfaces were employed as reflective surfaces 20a.

Then, as in Example 2-3, mounting patterns 7 were formed on the material substrate on which the reflective surfaces 20a and the optical path groove 20 had been formed, and the submount 4D was obtained by cutting the material substrate into unit pieces. The PD 2 was then mounted on the submount 4D, whereby the submodule 6D was obtained. In the submodule 6D of this Example, the PD 2 was mounted on the submount 4D such that one surface of the PD 2 opposed to the other surface thereof on the light receiving area 2a side made contact with the mounting pattern 7 and the PD 2 was positioned to lie over the optical path groove 20. The submount 4D was the same size as that in Example 1.

In this Example 2-4, the submodule 6D was mounted on the package 5 (see FIGS. 2(A) and 2(B)) such that a light receiving area 2a of the PD 2 was extended nearly perpendicular to the optical axis of the incident light L from the optical fiber (see FIGS. 2(A) and 2(B)), i.e., that each of the reflective surfaces 20a of the submount 4D was positioned to face or intersect the optical axis. In this state, the light receiving area 2a of the PD 2 was oriented to face upward as shown in FIG. 8(B). Subsequent manufacturing steps were similar to those in Example 1 described above.

With such an arrangement, as shown in FIG. 8(B), the incident light L having impinged upon one reflective surface 20a of the submount 4D changes its optical path to be introduced to the optical path groove 20, and after passing through the optical path groove 20, impinges upon the other reflective surface 20a, which causes the incident light to change the optical path again to enter the light receiving area 2a of the PD 2.

EXAMPLE 3

Case of Using PD of Front Illuminated Type

Figure 9A:
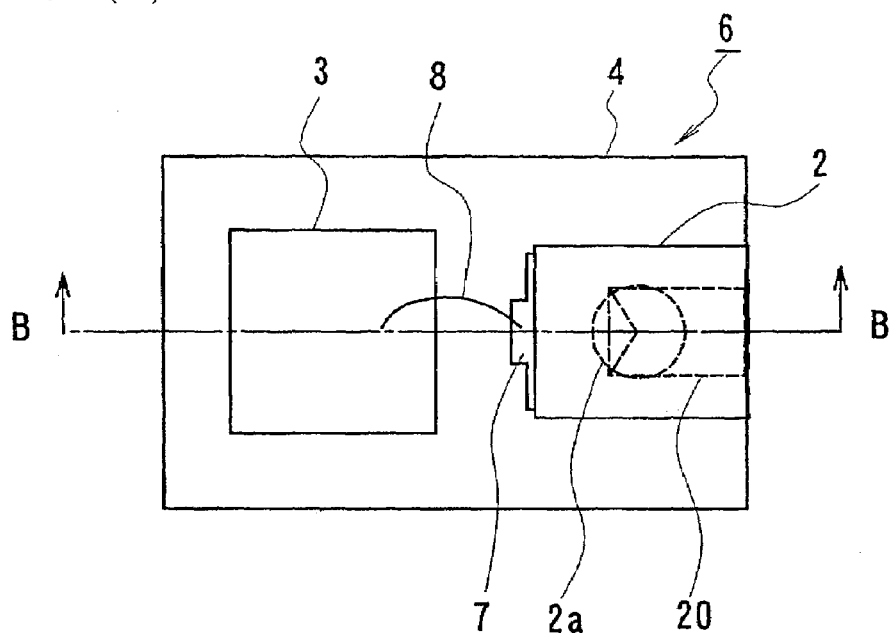
Figure 9B:
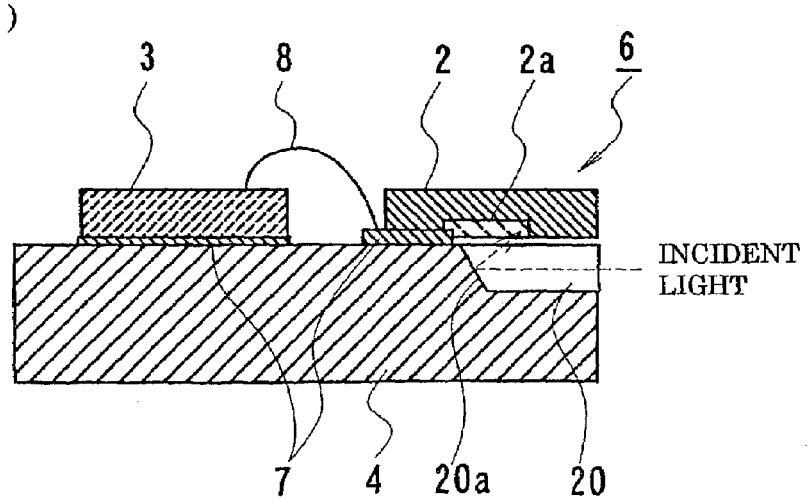

FIGS. 9(A) and 9(B) are enlarged schematic views of a submodule using a PD of the front illuminated type, in which FIG. 9(A) is a front view and FIG. 9(B) is a sectional view taken along a section line B—B in FIG. 9(A). In the optical receiver of the present invention, the optical receiving device may be a PD of the front illuminated type instead of the PD of the edge illuminated type shown in Example 1 and the PD of the rear illuminated type shown in Example 2. The basic construction and manufacturing steps in this Example 3 are similar to those in Example 2-3. The PD 2 is mounted on the submount 4 on which the reflective surface 20a and the optical path groove 20 have been formed. In this Example 3, the PD 2 is arranged such that the light receiving area 2a faces the submount 4. The light receiving area 2a and the preamplifier IC 3 are connected to each other through the mounting pattern 7 and the wire 8. This Example is preferably applied to the case in which the operation at a high level such as achievable with the PD of the rear illuminated type shown in Example 2 is not required.

EXAMPLE 4

Case of Mounting PD in Inclined State

Figure 10:
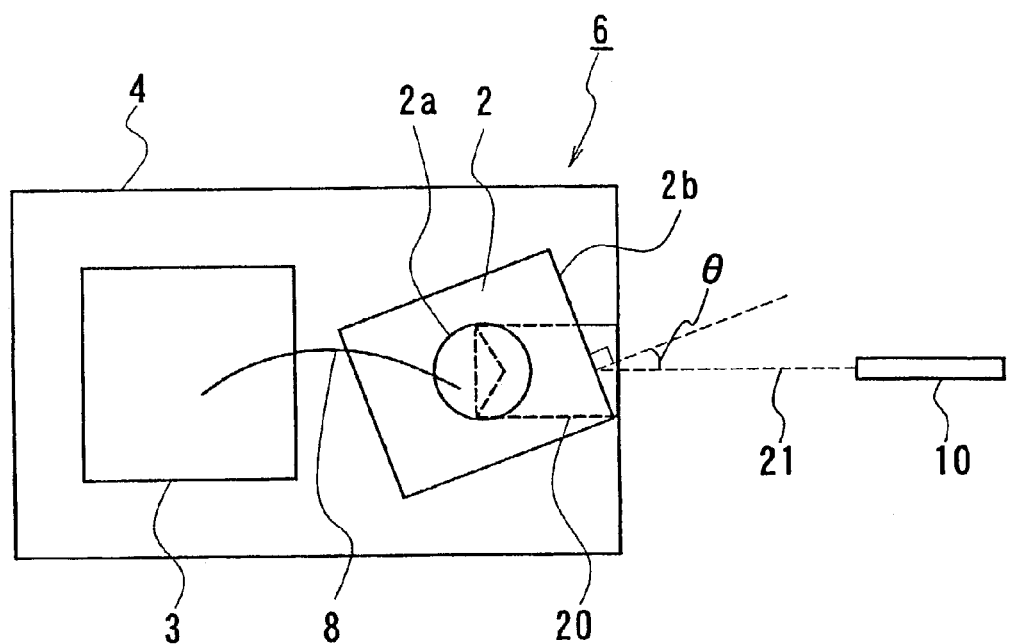
FIG. 10 is a front view of a submodule showing a state in which a PD is mounted on a substrate such that an edge face of the PD is inclined relative to the optical axis of the incident light.

FIG. 10 is a front view of a submodule showing a state in which a PD edge face is mounted on a substrate at an inclination relative to the optical axis of the incident light. In a submodule 6 shown in FIG. 10, a PD 2 is mounted on a submount 4 such that a perpendicular to an edge face 2b of the PD 2 (i.e., a surface of the PD 2 positioned to face or receive the incident light) is inclined at θ=8° relative to the optical axis 21 of the incident light. With such an arrangement, even when the incident light is reflected by the edge face 2b, this Example can prevent the incident light from returning to the optical fiber 10 side, and hence the problem of causing unstable operation of a light emitting device on the sending side can be eliminated. The above-described mounting can be advantageously applied to the case in which the PD edge face is arranged to face the optical axis of the incident light as in Examples 1, 2-1 to 2-3, 3 and 4. This mounting is also applicable to a receptacle-type optical receiver described below.

<Receptacle Type>

EXAMPLE 5

Figure 11:
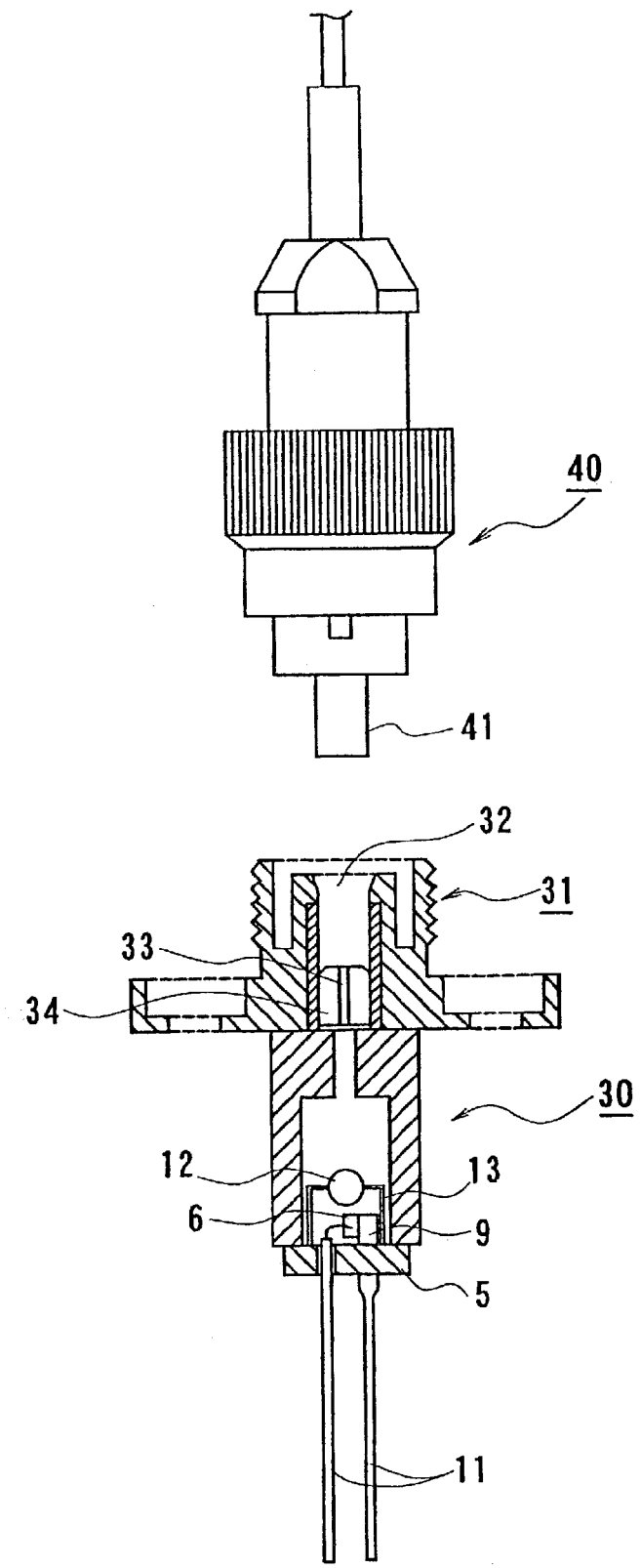
FIG. 11 is a longitudinal sectional view showing one example of a receptacle-type optical receiver of the present invention.
Figure 12:
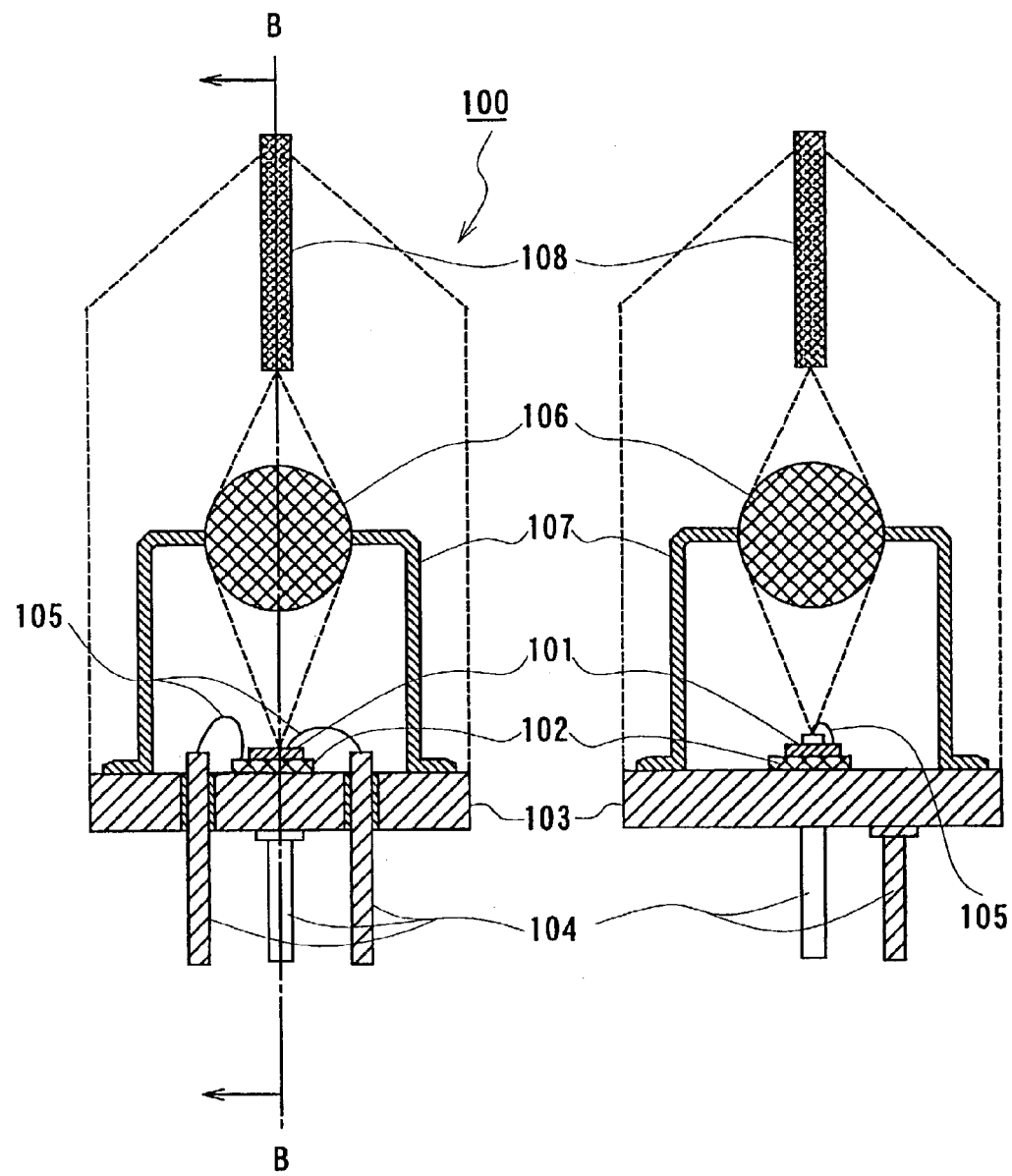
Figure 13:
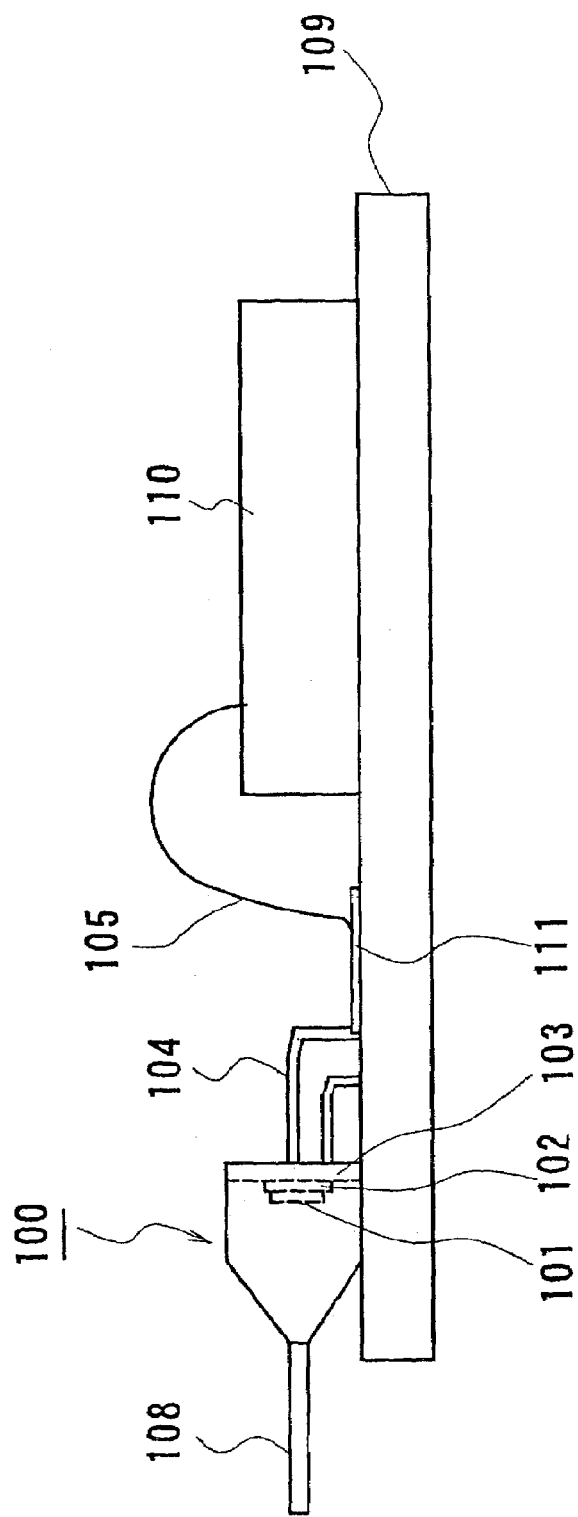
FIG. 13 is a side view showing a state in which the conventional optical receiver is mounted on a board.

FIG. 11 is a longitudinal sectional view showing one example of a receptacle-type optical receiver of the present invention. While Examples 1 to 4 have been described in connection with the optical receivers of the pig tail type, the optical receiver of the present invention can also be applied to the receptacle type as well. An optical receiver 30 of this Example includes a connecting portion 31 on the upper side as viewed in FIG. 11, which is connected to a connector 40 provided with an optical fiber ferrule 41, and a package 5 for holding the submodule 6 on the lower side. The connecting portion 31 has an insertion hole 32 into which the optical fiber ferrule 41 is inserted. In this Example, a stub 34 including an optical fiber 33 therein is arranged at an end (on the side nearer to the package 5) of the insertion hole 32. Similarly to the package in Example 1, etc., the package 5 is provided with a pole 9 on which the submodule 6 is mounted, and lead pins 11 for supplying electrical power and flowing out electrical signals. Further, like Example 1, etc., a cap 13 provided with a converging lens 12 at its top portion is placed on the package 5.

As with Examples 1 to 4, the optical receiver 30 of this Example can also greatly reduce parasitic inductance and parasitic capacitance, and is adaptable for high speed response.

What is claimed is:

1. An optical receiver comprising:
   a rear-illuminated type optical receiving device for receiving an incident light from an optical fiber;
   an amplifier for amplifying an electrical signal from said optical receiving device;
   a substrate on which said optical receiving device and said amplifier are mounted on the same plane; and
   a cylindrical coaxial-type package having a central axis that is coaxial with an optical axis of the incident light and including a block-shaped pole on one surface thereof that is perpendicular to the optical axis,
   wherein said substrate is formed of any of a Si single crystal, glass, and a ceramic, is provided with a reflective surface for introducing the incident light to the optical receiving device by changing an optical path of the incident light, and is mounted on a lateral surface of the pole.

2. An optical receiver according to claim 1, wherein said substrate is further provided with an optical path groove for incident light.

3. An optical receiver according to claim 2, wherein said optical path groove is formed by etching.

4. An optical receiver according to claim 1, wherein said optical receiving device is mounted on said substrate such that an edge face of said optical receiving device is not extended perpendicular to an optical axis of the incident light.

5. An optical receiver according to claim 1, wherein said optical receiving device is formed of an InGaAs-base material or an InGaAsP-base material, and has a light receiving layer covering a wavelength band from 1 µm to 1.6 µm.

6. An optical receiver according to claim 1, wherein said optical receiver is of a pig tail type having said optical fiber at one end thereof.

7. An optical receiver according to claim 1, wherein said optical receiver is of a receptacle type having a connecting portion to an optical connector at one end thereof.

* * * * *